United States Patent [19]
Dickerson

[11] Patent Number: 5,428,834
[45] Date of Patent: * Jun. 27, 1995

[54] METHOD AND CIRCUIT FOR PROCESSING AND FILTERING SIGNALS

[75] Inventor: Roger W. Dickerson, Loveland, Ohio

[73] Assignee: Xetron Corporation, Cincinatti, Ohio

[ * ] Notice: The portion of the term of this patent subsequent to Nov. 16, 2010 has been disclaimed.

[21] Appl. No.: 134,807

[22] Filed: Oct. 12, 1993

Related U.S. Application Data

[63] Continuation-in-part of Ser. No. 806,058, Dec. 11, 1991, Pat. No. 5,263,191.

[51] Int. Cl.$^6$ .................................. H04B 1/10
[52] U.S. Cl. ................................ 455/304; 455/65;
    375/346; 327/311; 327/317; 327/361
[58] Field of Search .............. 375/102, 104, 99, 100,
    375/11-15; 328/162, 165, 164; 360/38.1;
    358/314; 329/320; 455/295, 296, 65, 304;
    307/556, 542; 364/724.19, 724.2; 333/18, 28 R

[56] References Cited

U.S. PATENT DOCUMENTS

| | | | |
|---|---|---|---|
| 3,693,100 | 9/1972 | Brown et al. | 328/165 |
| 4,210,933 | 7/1980 | Heitmann | 455/99 |
| 4,238,746 | 12/1980 | McCool et al. | 333/166 |
| 4,344,177 | 8/1982 | Kustka | 364/724.2 |
| 4,359,778 | 11/1982 | Lee | 375/13 |
| 4,669,091 | 5/1987 | Nossen | 455/305 |
| 4,726,035 | 2/1988 | Bullock et al. | 333/18 |
| 4,726,036 | 2/1988 | Sawyer et al. | 375/14 |
| 5,263,191 | 11/1993 | Dickerson | 455/304 |
| 5,339,456 | 8/1994 | Dickerson | 455/303 |
| 5,355,533 | 10/1994 | Dickerson | 455/306 |

*Primary Examiner*—Edward F. Urban
*Assistant Examiner*—Mark D. Wisler

[57] ABSTRACT

A method for processing electrical signals includes the steps of: storing a plurality of first data signals, each representative of an instantaneous amplitude of a first input signal in a memory; selecting one of the first data signals in response to a second input signal; combining the selected one of the first data signals with a second data signal representative of a subsequent instantaneous amplitude of the first input signal, to produce a difference signal; producing a first output signal in response to the difference signal; and combining the difference signal and the selected first data signal to produce a modified data signal and for replacing the selected one of the first data signals with the modified data signal in the memory. The method can be performed by an equalizer in a circuit for compensating for amplitude variations in a radio frequency signal or by a comb notch filter. The invention also encompasses circuits and combinations of such circuits which perform the above signal processing method.

23 Claims, 7 Drawing Sheets

1

METHOD AND CIRCUIT FOR PROCESSING AND FILTERING SIGNALS

CROSS REFERENCE TO RELATED APPLICATION

This is a continuation-in-part of allowed application Ser. No. 07/806,058, filed Dec. 11, 1991, and entitled "Method And Circuit For Processing And Filtering Signals" now U.S. Pat. No. 6,263,191.

BACKGROUND OF THE INVENTION

This invention relates to methods and circuits for processing and filtering signals. Such methods and circuits can be particularly adapted to reduce amplitude variations in angle modulated radio frequency signals, or to provide comb notch filtering that removes interference of a repetitive nature.

Multipath phenomena results from multiple paths taken by a transmitted radio frequency signal before the signal reaches a receiver. Transmission of the signal along these paths results in constructive and destructive interference which causes amplitude variations that are a function of the signal's instantaneous frequency. These variations in amplitude complicate subsequent signal processing. For example, in the reception of radio frequency signals, a situation is frequently encountered in which a weak signal of interest (SOI) is subject to interference by a strong interfering signal having a frequency band which encompasses that of the SOI. The interfering signal may be, for example, a jamming signal or a commercial radio or television signal. If the interfering signal is an angle modulated signal, variations in amplitude whether caused by multipath phenomena or otherwise, can further mask the signal of interest, making detection of the signal of interest more difficult.

Interference of a repetitive nature can also cause harmonic interference, in which case it is desirable to remove the harmonic components of a signal. A comb notch filter may be used for such purposes.

The present invention seeks to provide a method and circuit for processing radio frequency signals to filter the signals or to remove the effects of amplitude variations wherein the amplitude variations are correlated with the instantaneous frequency of the signal.

SUMMARY OF THE INVENTION

A circuit for processing electrical signals constructed in accordance with this invention includes: a memory having a plurality of addresses for storing a plurality of first data signals, each representative of an instantaneous amplitude of a first input signal; means for selecting one of the first data signals in response to a second input signal; means for combining the selected one of the first data signals with a second data signal representative of a subsequent instantaneous amplitude of the first input signal, to produce a difference signal; means for producing a first output signal in response to the difference signal; and means for combining the difference signal and the selected one of the first data signals to produce a modified data signal and for replacing the selected first data signal with the modified data signal in the memory.

This invention further encompasses the use of two of the above circuits connected in series, or cascade, wherein the second input signal of one of the circuits is a first, second or higher order derivative of the second input signal of the other one of the circuits.

The above circuit can serve as an equalizer circuit for removing, or compensating for, the effects of amplitude variations in a radio frequency signal, constructed in accordance with this invention which comprises: a memory having a plurality of addresses for storing a plurality of first data signals, each representative of an instantaneous amplitude of a first input signal, wherein the amplitude variations are correlated with the instantaneous frequency of the signal; a first analog to digital converter for producing an address signal for selecting one of the first data signals in response to a first input signal, the first input signal being correlated with the interfering signal; a first adder for combining the selected one of the first data signals with a second data signal representative of a subsequent instantaneous amplitude of the composite signal, to produce a difference signal; and a second adder for combining the difference signal and the selected one of the first data signals to produce a modified data signal and for replacing the selected one of the first data signals with the modified data signal in the memory. The data signals used in this invention can be either digital signals or sampled analog signals. If digital signals are used, a first digital to analog converter can be used to produce a first analog output signal in response to the difference signal. If sampled analog signals are used, the difference signal can serve as the output signal, or the output signal can be a signal representative of the difference signal.

The invention also includes a method for processing electrical signals comprising the steps of: providing a memory having a plurality of addresses for storing a plurality of first data signals, each representative of an instantaneous amplitude of a first input signal; selecting one of the first data signals in response to a second input signal; combining the selected one of the first data signals with a second data signal representative of a subsequent instantaneous amplitude of the first input signal, to produce a difference signal; and combining the difference signal and the selected one of the first data signals to produce a modified data signal and for replacing the selected one of the first data signals with the modified data signal in the memory. If digital signals are used, a first analog output signal can be produced in response to the difference signal. If sampled analog signals are used, the difference signal can serve as the output signal, or the output signal can be a signal representative of the difference signal.

The invention further encompasses the method for compensating for amplitude variations in an angle modulated radio frequency signal, comprising the steps of: providing a memory having a plurality of addresses for storing a plurality of first data signals, each representative of an instantaneous amplitude of a composite signal, wherein the composite signal includes a signal of interest and an interfering signal; selecting one of the first data signals in response to a first input signal, the first input signal being correlated with the interfering signal; combining the selected one of the first data signals with a second data signal representative of a subsequent instantaneous amplitude of the composite signal, to produce a difference signal; combining the difference signal and the selected one of the first data signals to produce a modified data signal; and replacing the selected one of the first data signals with the modified data signal in the memory. If digital signals are used, a first analog output signal can be produced in response to the difference signal. If sampled analog signals are used, the difference signal can serve as the output signal, or the output signal can be a signal representative of the difference signal.

BRIEF DESCRIPTION OF THE DRAWINGS

The invention will become more readily apparent to those skilled in the art through the following description of the preferred embodiment thereof, as illustrated in the drawings, wherein.

DESCRIPTION OF THE PREFERRED EMBODIMENT

Figure 1:
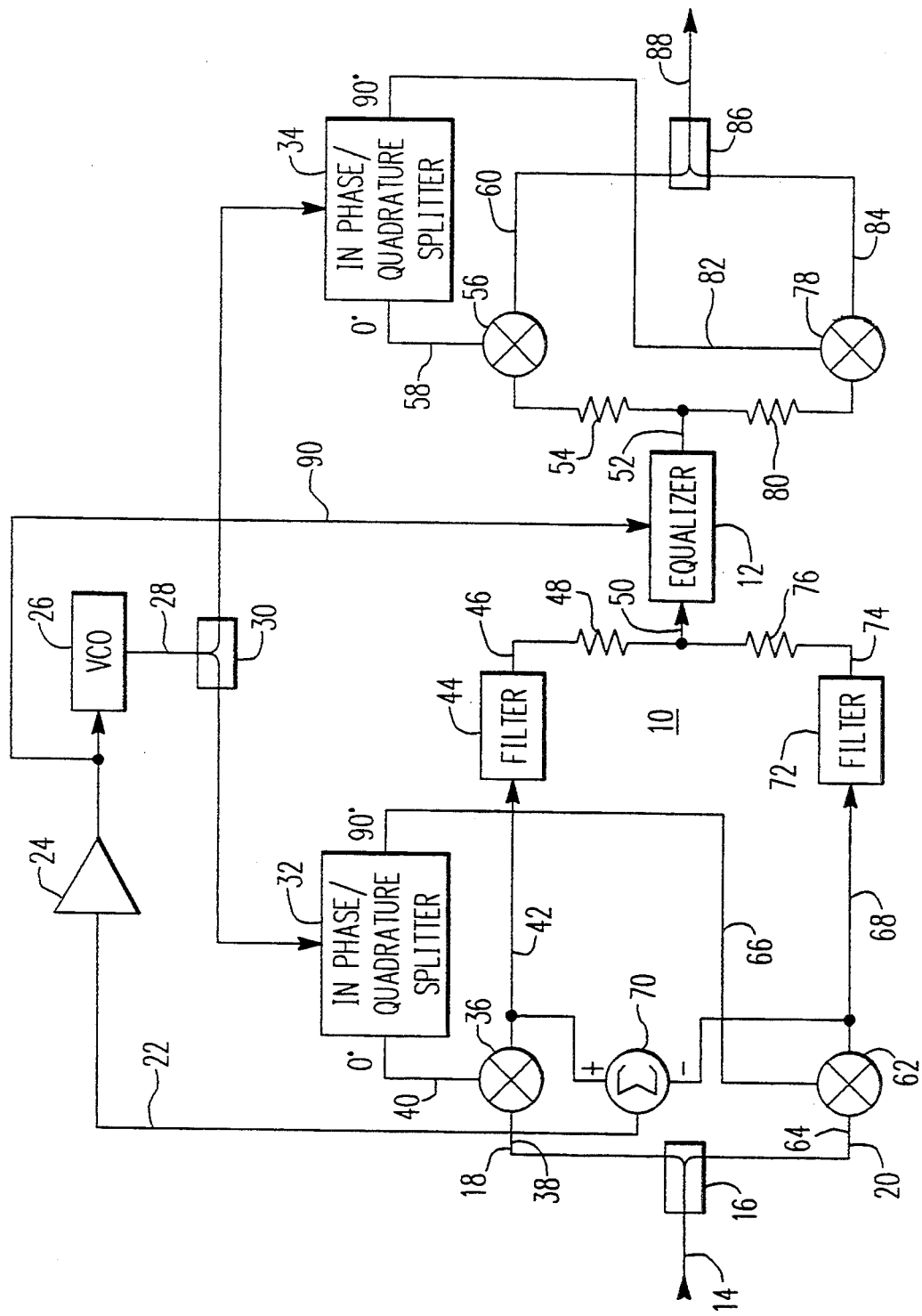
FIG. 1 is a block diagram of an interference suppression circuit which includes an equalization circuit constructed in accordance with this invention.

Referring to the drawings, FIG. 1 is a block diagram of an interference suppression circuit 10, having an equalization circuit 12 constructed in accordance with this invention. The circuit of FIG. 1 provides non-cooperative suppression of high-level interference signals to enhance the detection of a co-channel low-level signal of interest (SOI). In this context, non-cooperative suppression refers to suppression of an interfering signal which does not require a reference sample of the interfering signal. The circuit operates on an interference corrupted signal to produce an enhanced version of the desired SOI. The circuit of this invention can be readily retrofitted within the intermediate frequency (IF) stage of existing receiver systems.

A composite signal, including both an angle modulated interfering signal (I) and a signal of interest (SOI) is supplied to the interference suppression circuit 10 by way of input line 14. A signal splitter 16 splits the composite signal and delivers it to a first channel 18 and a second channel 20. An error signal on line 22 is amplified by amplifier 24 and used by a voltage controlled oscillator 26 to produce a reference signal on line 28. The reference signal on line 28 is split by a splitter 30 and sent to first and second in-phase/quadrature splitters 32 and 34, respectively. The in-phase/quadrature splitters produce a first output which is the in-phase component of the reference signal (0 degrees) and a second output which is the quadrature component of the reference signal (90 degrees). A first mixer 36 mixes the composite signal on line 38 with the in-phase component of the reference signal on line 40 to produce a first compound signal on line 42. A filter 44 removes selected components of the first compound signal to produce a first filtered signal on line 46. The filtered signal is delivered via resistor 48 to line 50 where it is combined with a second filtered signal from filter 72 and passed to equalization circuit 12. The equalization circuit produces a modified signal on line 52 which is delivered via resistor 54 to a second mixer 56. The second mixer mixes the modified signal on line 52 with an in-phase component of the reference signal on line 58 to produce a second compound signal on line 60.

A third mixer 62 mixes the composite signal on line 64 with a quadrature component of the reference signal on line 66 to produce a third compound signal on line 68. The error signal on line 22 is the difference in voltage of the first and third compound signals as produced at the output of summation point 70. A second filter 72, which is matched to filter 44, removes selected components of the third compound signal and produces the second filtered signal on line 74. The second filtered signal is combined with the first filtered signal and delivered to the equalization circuit 12 via resistor 76 and line 50. A fourth mixer 78 receives the modified signal on line 52, via resistor 80 and mixes the modified signal with a quadrature component of the reference signal on line 82 to produce a fourth compound signal on line 84. The second and fourth compound signals are combined by combiner 86 to produce an output signal on line 88. The spectral power density of the signal of interest in the output signal is greater than the spectral power density of the interfering signal in the output signal. Therefore the signal of interest in the output signal can be easily captured by well known signal capture circuits. The amplified error signal on line 90 is correlated with the interfering signal portion of the first and second filtered signals. This correlated signal is used to select addresses in a memory of the equalizer as is discussed below. The error signal that drives the VCO is proportional to the instantaneous frequency of the VCO and the interfering signal.

The circuit of FIG. 1 is particularly directed to those instances where the angle modulated interfering signal (I) has a constant envelope with a bandwidth encompassing that of the signal of interest (SOI). The interfering signal may have an inherent amplitude variation which is dependent upon the amount of angle modulation, and will have additional amplitude variation due to multipath phenomena. This amplitude modulation is relatively well defined. The circuit of FIG. 1 is provided as an example of the type of circuit which can benefit from the addition of the equalization circuit of this invention. A detailed description of the operation of the circuit of FIG. 1 is not required in order to practice the present invention, since the invention can be applied to a wide variety of circuits in which an angle modulated signal is subject to undesired amplitude variations.

Figure 2:
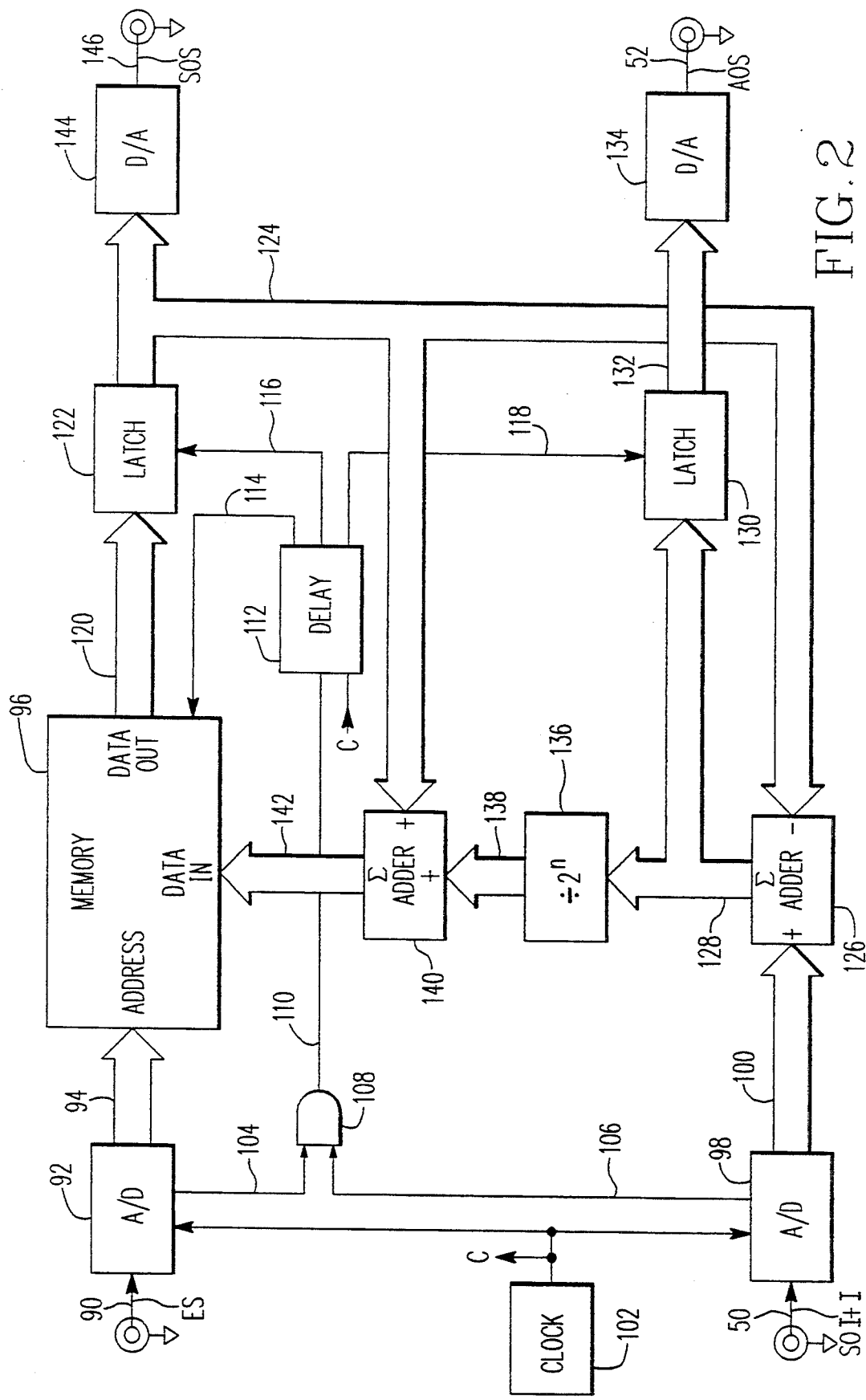
FIG. 2 is a block diagram of a first embodiment of the equalization circuit of FIG. 1.

FIG. 2 is a block diagram of a first embodiment of an equalization circuit constructed in accordance with this invention, and suitable for use as the equalization circuit in FIG. 1. Circuits constructed in accordance with the equalization circuit of FIG. 2 estimate the amplitude variation signature in the interfering signal and subtract it from the filtered signals to reduce the amount of amplitude variation in the resulting modified filtered signal. The estimation is accomplished by repeatedly sampling the input signal and combining the sampled value with a previously stored value to obtain an updated value which replaces the previously stored value. The updated value is typically closer to the previously stored value than the sampled value. In FIG. 2, a first analog to digital converter 92 receives the error signal (ES) on line 90. The error signal is correlated with an interfering signal wherein the interfering signal is one component of a composite signal on line 50. The composite signal on line 50 also includes a signal of interest.

Analog to digital converter 92 produces a digital output signal, representative of the instantaneous amplitude of the signal on line 90, on data bus 94. The data signal on line 94 is used to select an address in memory 96. As is explained below, memory 96 includes a plurality of addresses for storing first digital data signals which are representative of the previous values of the composite signal.

A second analog to digital converter 98 receives the composite signal, including both the interfering signal (I) and the signal of interest (SOI) on line 50, and produces a digital output signal on line 100 that is representative of the instantaneous value of the composite signal. Clock 102 controls the sequence of operations performed by the circuit of FIG. 2. In response to a predetermined change in polarity of the output pulses of clock 102, analog to digital converters 92 and 98 produce their respective output signals. The analog to digital converters also produce data ready signals on lines 104 and 106. These data ready signals are received by AND gate 108 and used to produce a voltage pulse on line 110. The voltage pulse on line 110 passes to delay circuit 112, which may be a shift register. Delay circuit 112 then produces output pulses on lines 114, 116 and 118. The first data signal is selected by the address identified by the signal on bus 94, and read out onto bus 120. Alternatively, selection of the first data signal may be done utilizing a software loop. The selected signal is then frozen by latch 122, which is controlled by a pulse on line 116. The frozen signal on bus 124 is delivered to adder 126 where it is subtracted from the signal on bus 100 to produce a digital difference signal on bus 128. Latch 130 freezes the digital difference signal on bus 132 in response to a voltage pulse on line 118. A first digital to analog converter 134 converts the digital signal on bus 132 to an analog output signal (AOS) on line 52. When this circuit is used in the circuit of FIG. 1, the output signal from digital to analog converter 134 is the modified filtered signal.

Scaling circuit 136 divides the digital difference signal on bus 128 by a preselected number to produce an incremental adjustment signal on bus 138. The incremental adjustment signal on bus 138 is then added to the first digital data signal on bus 124 to adder 140 to obtain a modified digital data signal on bus 142. A pulse on line 114 enables memory 96 to replace the selected first digital data signal previously read from the memory with the digital data signal on bus 142 at the address identified by the signal on bus 94. A second digital to analog converter 144 converts the first digital signal on bus 124 into a second output signal (SOS) on line 146. The second output signal (which is not used by the circuit of FIG. 1) is representative of the interfering signal component of the composite signal.

The circuit of FIG. 2 uses a successive estimation technique to update the data in the memory so that the stored data approaches an accurate representation of the amplitude modulation of the interfering signal. The amount by which the values of the stored data are adjusted (attack rate) is controlled by changing the value of the divisor in scaling circuit 136. The input signal on line 50 is a composite signal which includes a signal of interest and an undesired interfering signal, wherein the signal of interest can be considered to be a deviation from the average of the composite signal. The input signal on line 90 is a signal which is correlated with the interfering signal. The output signal on line 52 is an uncorrelated amplitude modulated signal which is representative of the signal of interest. The output signal on line 146 is a correlated amplitude modulated signal representative of the interfering signal.

Figure 3:
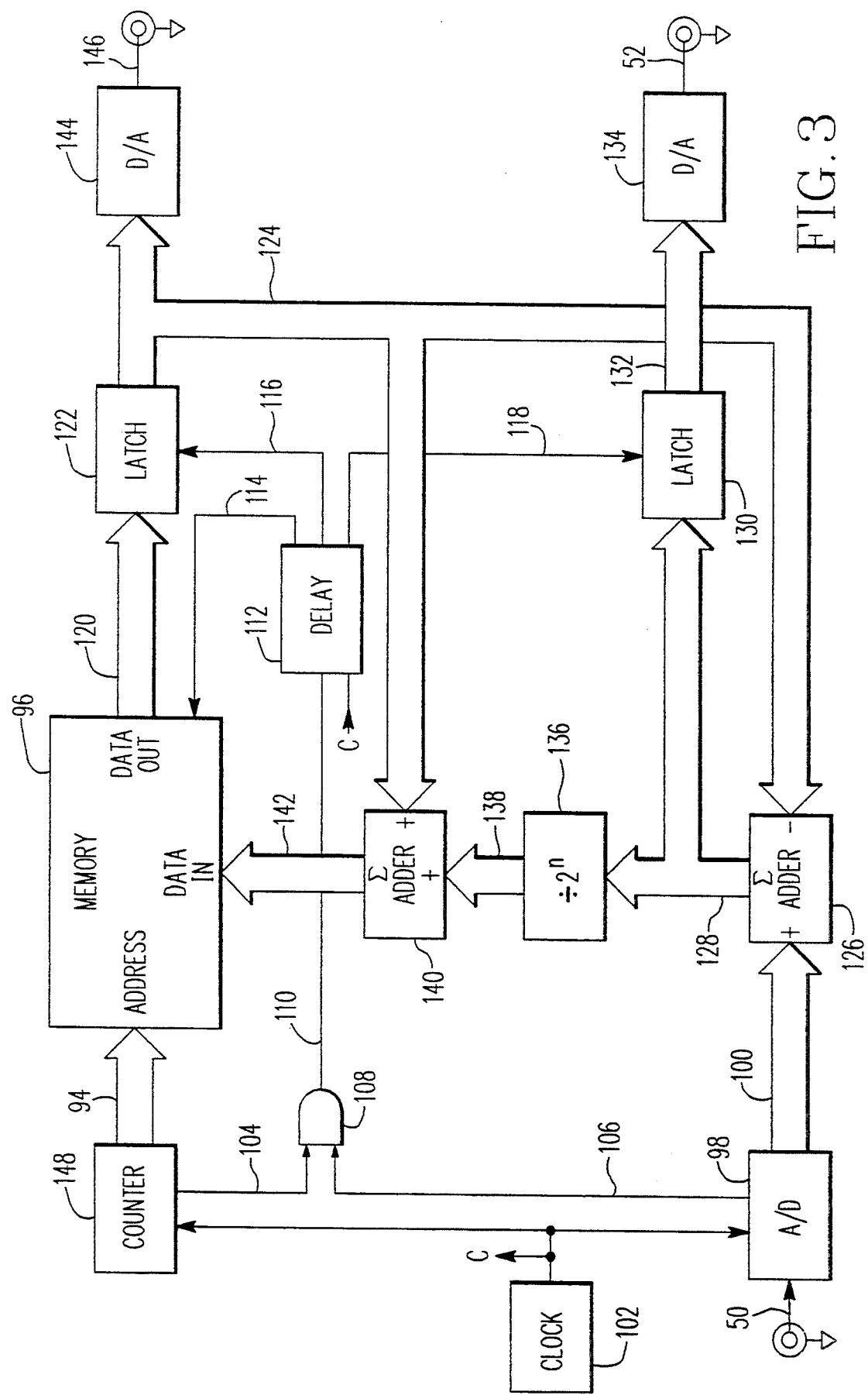
FIG. 3 is a block diagram of a first embodiment of a filter circuit constructed in accordance with this invention.

FIG. 3 is a block diagram of a comb notch filter which uses the circuit of this invention. This circuit is similar to the circuit of FIG. 2 except that the analog to digital converter 92 in FIG. 2 has been replaced by a counter 148. The signal to be filtered is applied to input line 50. Clock 102 controls the sampling rate of analog to digital converter 98 and also increments the counter to provide an address location on bus 94.

Figure 4:
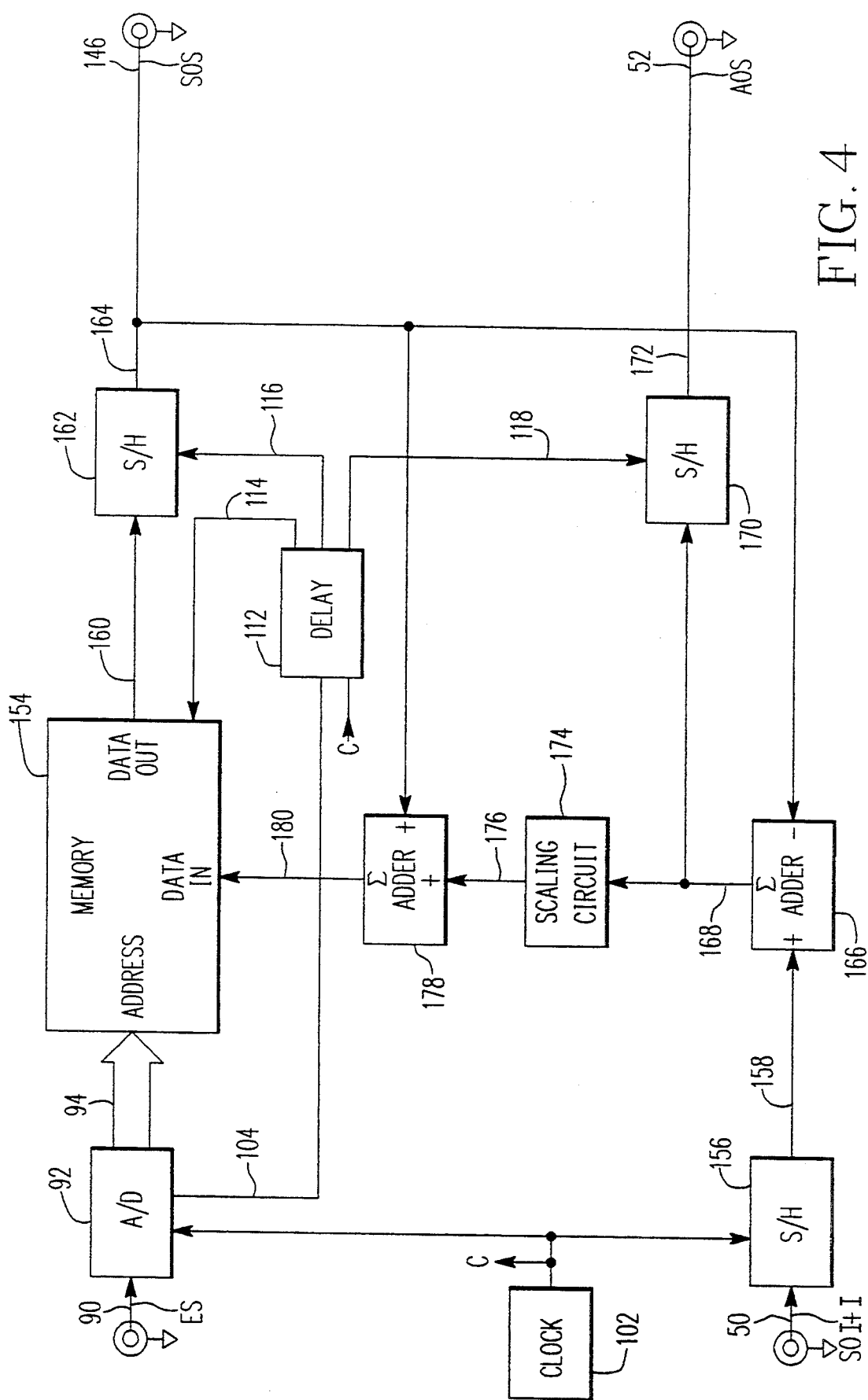
FIG. 4 is a block diagram of a second embodiment of the equalization circuit of FIG. 1.

FIG. 4 is a block diagram of a second embodiment of an equalization circuit constructed in accordance with this invention, and suitable for use as the equalization circuit in FIG. 1. As is the case for circuits constructed in accordance with the equalization circuit of FIG. 2, the circuit of FIG. 4 estimates the amplitude variation signature in the interfering signal and subtracts it from the filtered signals to reduce the amount of amplitude variation in the resulting modified filtered signal. The estimation is accomplished by repeatedly sampling the input signal and combining the sampled value with a previously stored value to obtain an updated value which replaces the previously stored value. The updated value is typically closer to the previously stored value than the sampled value. In FIG. 4, an analog to digital converter 92 receives the error signal (ES) on line 90. The error signal is correlated with an interfering signal wherein the interfering signal is one component of a composite signal on line 50. The composite signal on line 50 also includes a signal of interest. Analog to digital converter 92 produces a digital output signal, representative of the instantaneous amplitude of the signal on line 90, on data bus 94. The signal on bus 94 is used to select an address in memory 154. Memory 154 is an analog memory, which may include, for example, a charge coupled device array or a switched capacitor array. Memory 154 includes a plurality of addresses for storing first data signals which are representative of the previous sampled values of the composite signal.

A first sample and hold circuit 156 receives the composite signal, including both the interfering signal (I) and the signal of interest (SOI), on line 50, and produces a sampled analog output signal on line 158 that is representative of the instantaneous value of the composite signal. Clock 102 controls the sequence of operations performed by the circuit of FIG. 4. In response to a predetermined change in polarity of the output pulses of clock 102, analog to digital converter 92 and sample and hold circuit 156 produce their respective output signals. The analog to digital converter 92 also produces a data ready signals on line 104. This data ready signal passes to delay circuit 112. Delay circuit 112 then produces output pulses on lines 114, 116 and 118. The first data signal is selected by the address identified by the signal on bus 94, and read out onto line 160. The selected signal is then frozen by sample and hold circuit 162, which is controlled by a pulse on line 116. The frozen signal on line 164 is delivered to analog adder 166 where it is subtracted from the signal on line 158 to produce a difference signal on line 168. Sample and hold circuit 170 freezes the difference signal on line 172 in response to a voltage pulse on line 118. The frozen difference signal serves as the analog output signal (AOS) on line 52. When this circuit is used in the circuit of FIG. 1, the output signal is the modified filtered signal.

Scaling circuit 174 attenuates the difference signal on line 168 by a preselected amount to produce an incremental adjustment signal on line 176. The incremental adjustment signal on line 176 is then added to the first data signal on line 164 by adder 178 to obtain a modified data signal on line 180. A pulse on line 114 enables memory 154 to replace the selected first data signal previously read from the memory with the data signal on line 180 at the address identified by the signal on bus 94. The data signal on line 164 serves as a second output signal (SOS) on line 146. The second output signal (which is not used by the circuit of FIG. 1) is representative of the interfering signal component of the composite signal.

The circuit of FIG. 4 uses a successive estimation technique to update the data in the memory so that the stored data approaches an accurate representation of the amplitude modulation of the interfering signal. The amount by which the values of the stored data are adjusted (attack rate) is controlled by changing the amount of attenuation provided by scaling circuit 174. The input signal on line 50 is a composite signal which includes a signal of interest and an undesired interfering signal, wherein the signal of interest can be considered to be a deviation from the average of the composite signal. The input signal on line 90 is a signal which is correlated with the interfering signal. The output signal on line 52 is an uncorrelated amplitude modulated signal which is representative of the signal of interest. The output signal on line 146 is a correlated signal representative of the amplitude modulation of the interfering signal.

It should be apparent that the various embodiments of this invention can enhance the interception of low-level signals of interest in the presence of strong interference by reducing the interference due to amplitude variations in the interfering signal which tend to mask the signal of interest. The invention is also useful in circuits used to suppress co-site/co-channel interference in tactical and strategic communications systems.

The distorted version of interfering signal Y, present on line 50 or bus 100, can be represented as a polynomial of the form:

$$Y = \sum_{n=0}^{\infty} C_n X^n$$

where X is the interfering signal or value on line 90 or bus 94. The circuits of this invention learn the coefficients $C_n$ of the terms of the polynomial and subtract those terms from the composite signal, within the limits of the digital quantization. This is accomplished by using a memory having individual bins for each level of the interfering signal, thereby permitting each level to be handled separately.

Figure 5:
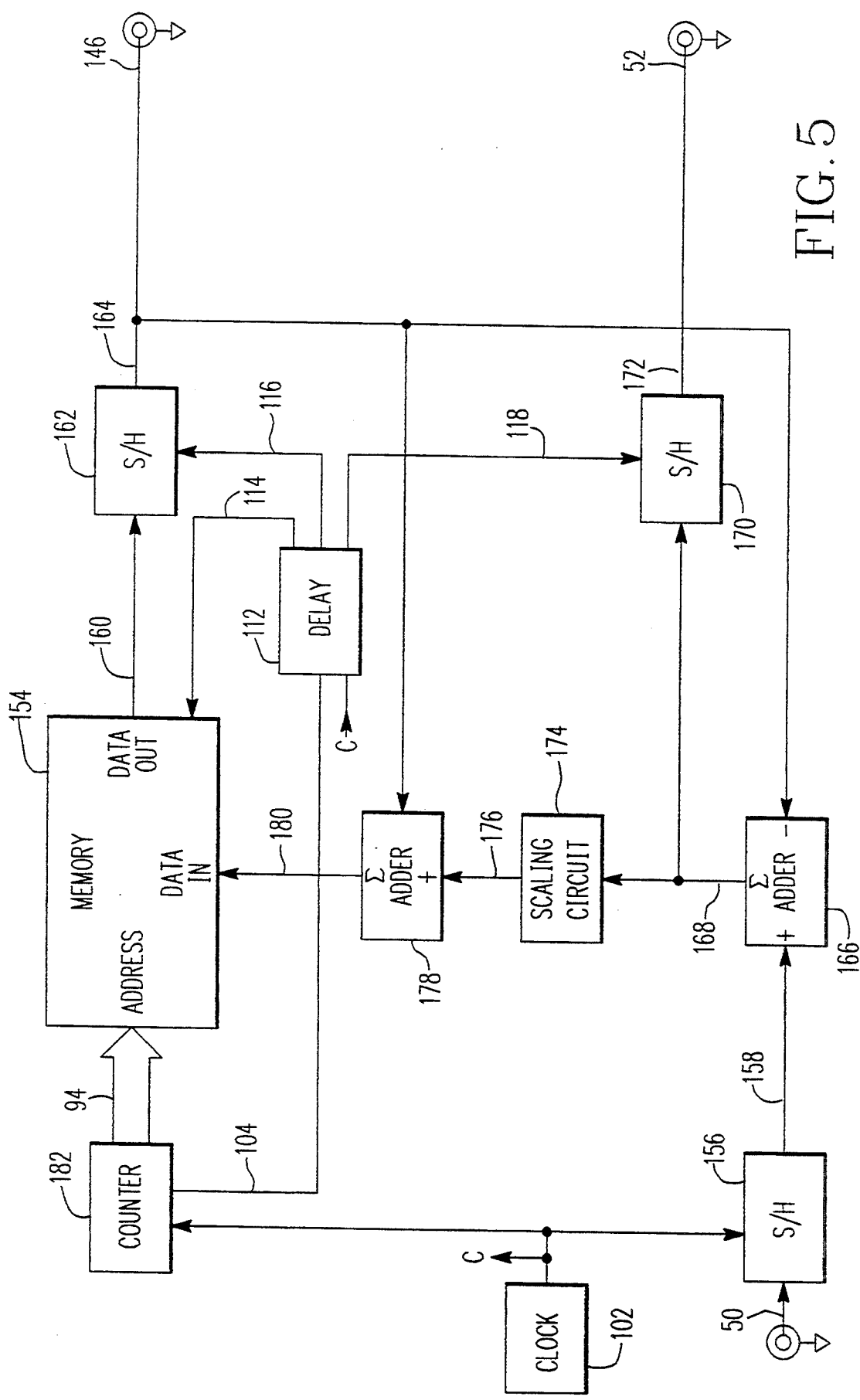
FIG. 5 is a block diagram of a second embodiment of a filter circuit constructed in accordance with this invention.
Figure 6:
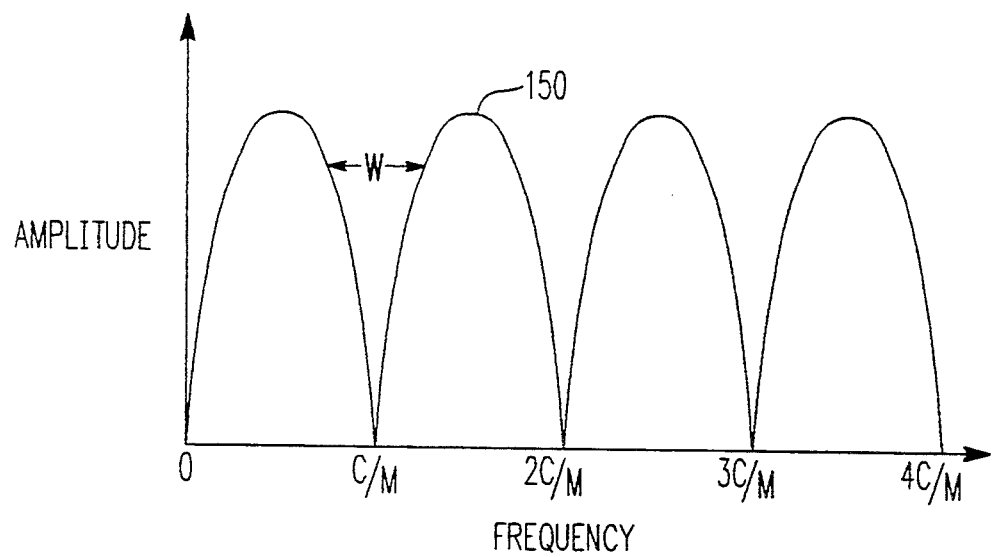
FIGS. 6 and 7 are diagrams which illustrate the operation of the filter circuits of FIGS. 3 and 5.
Figure 7:
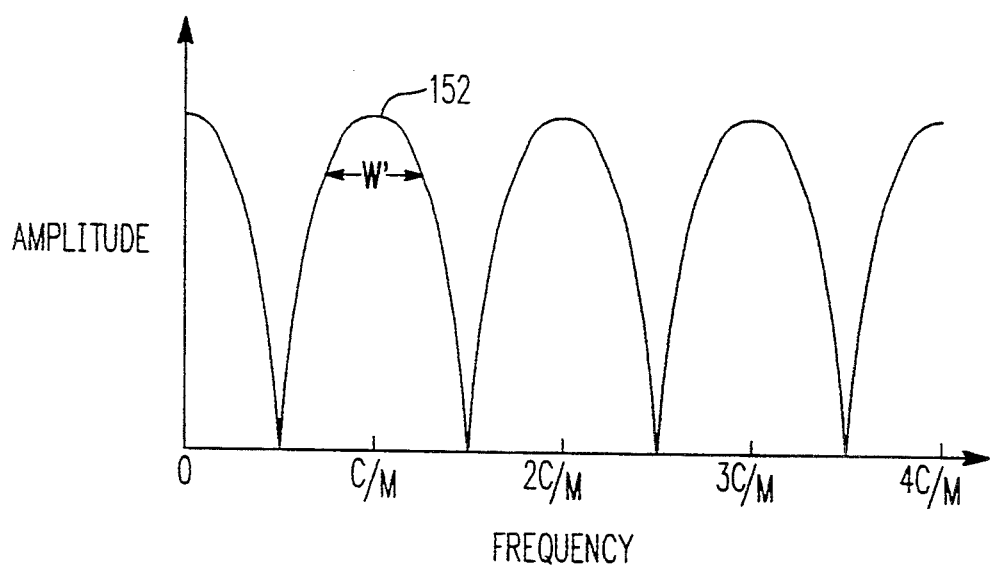

FIG. 5 is a block diagram of an analog comb notch filter which uses the circuit of this invention. This circuit is similar to the circuit of FIG. 4 except that the analog to digital converter 92 in FIG. 4 has been replaced by a counter 182. The signal to be filtered is applied to input line 50. Clock 102 controls the sampling rate of the sample and hold circuit 156 and also increments the counter to provide an address location on bus 94. The circuits of FIGS. 3 and 5 each produce an output on line 52 which is an uncorrelated notched output and is illustrated in FIG. 6, wherein C is the clock frequency and M is the maximum address on the data bus 94. The amplitude in FIG. 6 is the ratio of the amplitudes of the signals on line 52 and 50 as a function of frequency. The width of the notch W is directly proportional to the C/M ratio and inversely proportional to the sealing factor in block 136. The output on line 146 is a correlated bandpass output and is illustrated in FIG. 7, wherein C is the clock frequency and M is the maximum address on the data bus 94. The amplitude in FIG. 7 is the ratio of the amplitudes of the signals on lines 146 and 50. The width of the passband W' is directly proportional to the C/M ratio and inversely proportional to the sealing factor in block 136.

Figure 8:
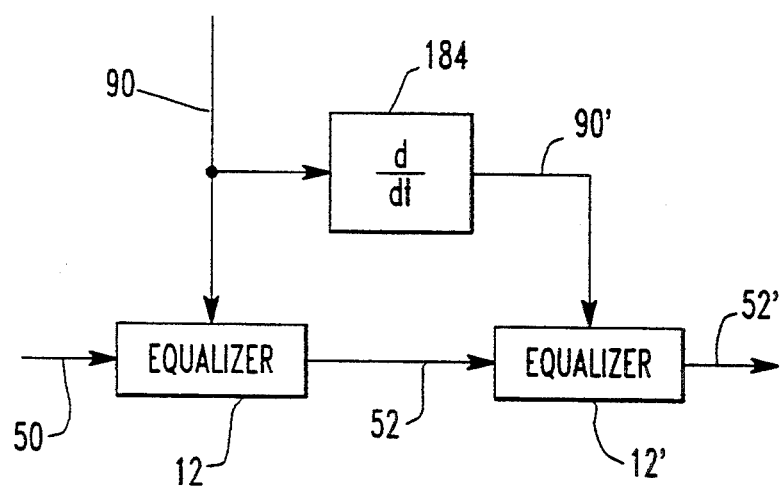
FIG. 8 is a block diagram of a cascade arrangement of equalizer circuits which may be used in the circuit of FIG. 1.

FIG. 8 is a block diagram of a cascade connection of equalizers which may be used in the circuit of FIG. 1. In this Figure, equalizer 12' is identical to equalizer 12, except that the error signal on line 90' which is delivered to equalizer 12' is the first derivative with respect to time of the error signal on line 90. This derivative is produced by a differentiation circuit as illustrated by block 184. Although the first derivative is used in this example, it should be understood that higher order derivatives may also be used. The circuit of FIG. 8 may be inserted into the circuit of FIG. 1, with the output 52' of equalizer 12' being connected to the junction point between resistors 54 and 80. By using a second, series connected equalizer having a derivative of the error signal as an input, improved performance can be achieved. As the rate of change of frequency of the interfering signal increases, some of the signal components relating to amplitude envelope variations become more significant. Since the correlation of the error signal with the instantaneous frequency of the interfering signal becomes less accurate as the multipath delay increases, the use of an error signal which is related to the derivative of the instantaneous frequency can provide improved performance. The derivative of the error signal may be taken with respect to time or another parameter, such as frequency.

Although the invention has been described in terms of its preferred embodiments, it will be apparent to those skilled in the art that various changes may be made without departing from the scope of the invention. It is therefore intended that the appended claims cover such changes.

I claim:

1. A circuit for processing electrical signals comprising:
    a memory having a plurality of addresses for storing a plurality of first data signals, each representative of an instantaneous amplitude of a first input signal;
    means for selecting one of said first data signals in response to a second input signal;
    means for combining the selected one of said first data signals with a second data signal representative of an additional instantaneous amplitude of said first input signal, to produce a difference signal;
    means for producing a first output signal in response to said difference signal; and
    means for combining said difference signal and the selected one of the first data signals to produce a modified data signal and for replacing the selected one of the first data signals with said modified data signal in said memory.

2. A circuit for processing electrical signals according to claim 1, wherein:
    the first input signal includes a signal of interest and an interfering signal; and
    said interfering signal being correlated with said second input signal.

3. A circuit for processing electrical signals according to claim 1, further comprising:
means for producing a second output signal in response to the selected one of said first data signals.

4. A circuit for processing electrical signals according to claim 1, wherein said means for combining said difference signal and the selected one of said first data signals to produce a modified data signal and for replacing the selected one of said first data signals with said modified data signal in said memory, comprises:
a scaling circuit for attenuating said difference signal by a preselected amount to produce a correction signal; and
an adder adding said correction signal to the selected first data signal to produce said modified data signal.

5. A circuit for processing electrical signals according to claim 1, wherein said means for selecting one of said first data signals in response to a second input signal comprises:
a counter for producing said second input signal in response to a clock signal.

6. A method for processing electrical signals comprising the steps of:
providing a memory having a plurality of addresses for storing a plurality of first data signals, each representative of an instantaneous amplitude of a first input signal;
selecting one of said first data signals in response to a second input signal;
combining the selected one of said first data signals with a second data signal representative of an additional instantaneous amplitude of said first input signal, to produce a difference signal;
producing a first output signal in response to said difference signal; and
combining said difference signal and the selected one of said first data signals to produce a modified data signal and replacing the selected one of said first data signals with said modified data signal in said memory.

7. A method for processing electrical signals according to claim 6, wherein:
the first input signal includes a signal of interest and an interfering signal; and
said interfering signal is correlated with said second input signal.

8. A method for processing electrical signals according to claim 6, further comprising the step of:
producing a second output signal in response to the selected one of said first data signals.

9. A method for processing electrical signals according to claim 6, wherein said step of combining said difference signal and the selected one of said first data signals to produce a modified data signal and for replacing the selected one of said first data signals with said modified data signal in said memory, comprises the steps of:
attenuating said difference signal by a preselected amount to produce a correction signal; and
adding said correction signal to the selected one of said first data signals to produce said modified data signal.

10. A circuit for compensating for amplitude variation in an angle modulated composite signal comprising:
a memory having a plurality of addresses for storing a plurality of first data signals, each representative of an instantaneous amplitude of the composite signal, wherein the composite signal includes a signal of interest and an interfering signal;
means for selecting one of said first data signals in response to a second input signal, said interfering signal being correlated with said second input signal;
means for combining the selected one of said first data signals with a second data signal representative of an additional instantaneous amplitude of said composite signal, to produce a difference signal;
means for producing a first analog output signal in response to said difference signal; and
means for combining said difference signal and the selected one of said first data signals to produce a modified data signal and for replacing the selected one of said first data signals with said modified data signal in said memory.

11. A circuit for compensating for amplitude variation in an angle modulated composite signal according to claim 10, further comprising:
means for producing a second output signal in response to the selected one of said data signals.

12. A circuit for compensating for amplitude variation in an angle modulated composite signal according to claim 10, wherein said means for combining said difference signal and the selected one of said first data signals to produce a modified data signal and for replacing the selected one of said first data signals with said modified data signal in said memory, comprises:
a scaling circuit for attenuating said difference signal by a preselected amount to produce a correction signal; and
an adder adding said correction signal to the selected one of said first data signals to produce said modified data signal.

13. A circuit for compensating for amplitude variation in an angle modulated composite signal comprising:
a memory having a plurality of addresses for storing a plurality of first data signals, each representative of an instantaneous amplitude of the composite signal, wherein the composite signal includes a signal of interest and an interfering signal;
a first analog to digital converter producing an address signal for selecting one of said first data signals in response to a second input signal, said second input signal being correlated with said interfering signal;
a first adder for combining the selected one of said first data signals with a second data signal representative of an additional instantaneous amplitude of said composite signal, to produce a difference signal;
means for producing a first analog output signal in response to said difference signal; and
a second adder for combining said difference signal and the selected one of said first data signals to produce a modified data signal and for replacing the selected one of said first data signals with said modified data signal in said memory.

14. A circuit for compensating for amplitude variation in an angle modulated composite signal according to claim 13, further comprising:
means for producing a second output signal in response to the selected one of said data signals.

15. A method for compensating for amplitude variation in an angle modulated composite signal, said method comprising the steps of:

providing a memory having a plurality of addresses for storing a plurality of first data signals, each representative of an instantaneous amplitude of the composite signal, wherein the composite signal includes a signal of interest and an interfering signal;

selecting one of said first data signals in response to a second input signal, said second input signal being correlated with said interfering signal;

combining the selected one of said first data signals with a second data signal representative of an additional instantaneous amplitude of said composite signal, to produce a difference signal;

producing a first analog output signal in response to said difference signal;

combining said difference signal and the selected one of said first data signals to produce a modified data signal; and replacing the selected one of said first data signals with said modified data signal in said memory.

16. A method for compensating for amplitude variation in an angle modulated composite signal according to claim 15, further comprising the step of:

producing a second output signal in response to the selected one of said data signals.

17. A method for compensating for amplitude variation in an angle modulated composite signal according to claim 15, wherein said step of combining said difference signal and the selected one of said first data signals to produce a modified data signal, comprises the steps of:

attenuating said difference signal by a preselected amount to produce a correction signal; and adding said correction signal to the selected one of said first data signals to produce said modified data signal.

18. A circuit for processing electrical signals comprising:

a first equalizer including a first memory having a plurality of addresses for storing a plurality of first data signals, each representative of an instantaneous amplitude of a first input signal; means for selecting one of said first data signals in response to a second input signal; means for combining the selected one of said first data signals with a second data signal representative of an additional instantaneous amplitude of said first input signal, to produce a first difference signal; means for producing a first output signal in response to said first difference signal; and means for combining said first difference signal and the selected one of the first data signals to produce a first modified data signal and for replacing the selected one of the first data signals with said first modified data signal in said first memory;

a second equalizer including a second memory having a plurality of addresses for storing a plurality of third data signals, each representative of an instantaneous amplitude of said first output signal; means for selecting one of said third data signals in response to a third input signal; means for combining the selected one of said third data signals with a fourth data signal representative of an additional instantaneous amplitude of said first output signal, to produce a second difference signal; means for producing a second output signal in response to said second difference signal; and means for combining said second difference signal and the selected one of the third data signals to produce a second modified data signal and for replacing the selected one of the third data signals with said second modified data signal in said second memory.

19. A circuit for processing electrical signals according to claim 18, wherein said third input signal is representative of a derivative of said second input signal.

20. A circuit for processing electrical signals according to claim 19, wherein said derivative is taken with respect to either time or frequency.

21. A method for processing electrical signals comprising the steps of:

providing a first memory having a plurality of addresses for storing a plurality of first data signals, each representative of an instantaneous amplitude of a first input signal;

selecting one of said first data signals in response to a second input signal;

combining the selected one of said first data signals with a second data signal representative of an additional instantaneous amplitude of said first input signal, to produce a first difference signal;

producing a first output signal in response to said first difference signal;

combining said first difference signal and the selected one of said first data signals to produce a first modified data signal and replacing the selected one of said first data signals with said first modified data signal in said first memory;

providing a second memory having a plurality of addresses for storing a plurality of third data signals, each representative of an instantaneous amplitude of said first output signal;

selecting one of said third data signals in response to a third input signal;

combining the selected one of said third data signals with a fourth data signal representative of an additional instantaneous amplitude of said first output signal, to produce a second difference signal;

producing a second output signal in response to said second difference signal;

combining said second difference signal and the selected one of said third data signals to produce a second modified data signal and replacing the selected one of said third data signals with said second modified data signal in said second memory.

22. A method for processing electrical signals according to claim 21, wherein said third input signal is representative of a derivative of said second input signal.

23. A circuit for processing electrical signals according to claim 22, wherein said derivative is taken with respect to either time or frequency.

* * * * *